United States Patent
Jeong et al.

(10) Patent No.: US 11,971,532 B2
(45) Date of Patent: Apr. 30, 2024

(54) MICROLENS ARRAY-BASED ULTRATHIN MICROSCOPE

(71) Applicant: KOREA ADVANCED INSTITUTE OF SCIENCE AND TECHNOLOGY, Daejeon (KR)

(72) Inventors: Ki-Hun Jeong, Daejeon (KR); Kyung-Won Jang, Daejeon (KR); Byounghoon Kang, Daejeon (KR); Younggil Cha, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 112 days.

(21) Appl. No.: 17/411,818

(22) Filed: Aug. 25, 2021

(65) Prior Publication Data
US 2022/0121023 A1    Apr. 21, 2022

(30) Foreign Application Priority Data

Oct. 19, 2020  (KR) .................. 10-2020-0135339
May 21, 2021  (KR) .................. 10-2021-0065522

(51) Int. Cl.
*G02B 21/36* (2006.01)
*G02B 3/00* (2006.01)
*G02B 13/00* (2006.01)
*G02B 21/16* (2006.01)
*H01L 27/146* (2006.01)

(52) U.S. Cl.
CPC ......... *G02B 21/361* (2013.01); *G02B 3/0006* (2013.01); *G02B 13/0085* (2013.01); *G02B 21/16* (2013.01); *H01L 27/14621* (2013.01); *H01L 27/14627* (2013.01)

(58) Field of Classification Search
CPC .. G02B 13/0085; G02B 21/16; G02B 21/361; G02B 2207/113; G02B 3/0006; G02B 3/0018; G02B 3/0056; H01L 27/14621; H01L 27/14627
USPC ........................................................ 348/79
See application file for complete search history.

(56) References Cited

FOREIGN PATENT DOCUMENTS

KR    20080068373 A    7/2008

OTHER PUBLICATIONS

S. Schacke, R. Berlich, B. Höfer, P. Dannberg, B. Zaage, C. Damm, E. Beckert, N. Danz, "Towards an ultrathin multi-aperture microscope," Proc. SPIE 11243, Imaging, Manipulation, and Analysis of Biomolecules, Cells, and Tissues XVIII, 1124311 (Feb. 17, 2020); doi: 10.1117/12.2544762. (Year: 2020).*

(Continued)

*Primary Examiner* — Christopher S Kelley
*Assistant Examiner* — Ana Picon-Feliciano
(74) *Attorney, Agent, or Firm* — Workman Nydegger (57) ABSTRACT

A microlens array-based ultrathin microscope is provided. The microlens array-based ultrathin microscope includes a filter unit configured to selectively transmit fluorescence manifested in a measurement sample, and an image unit configured to acquire an image from light transmitted by the filter unit. The filter unit is formed to be in contact with or spaced apart from one surface of a transparent substrate, and the image unit includes a microlens array formed on an opposite surface to the transparent substrate in which the filter unit is formed, and an image sensor configured to collect image information of the microlens array.

17 Claims, 8 Drawing Sheets

(56) References Cited

OTHER PUBLICATIONS

Brückner A, Oberdörster A, Dunkel J, Berlich R, Wippermann F. Multi-aperture approaches to miniaturized vision systems. In2014 13th Workshop on Information Optics (WIO) Jul. 7, 2014 (pp. 1-4). IEEE. (Year: 2014).*

Kim, Sin Hyeong; "Shape Error and Its Compensation in the Fabrication of Microlens Array Using Photoresist Thermal Reflow Mehtod", Journal of the Microelectronics & Packaging Society, Jun. 2013, vol. 20, No. 2, p. 23-28. 2013.

* cited by examiner

MICROLENS ARRAY-BASED ULTRATHIN MICROSCOPE

CROSS-REFERENCE TO RELATED APPLICATION(S)

This application claims the priority benefit of Korean Patent Application No. 10-2020-0135339 filed on Oct. 19, 2020, and Korean Patent Application No. 10-2021-0065522 filed on May 21, 2021, in the Korean Intellectual Property Office, the disclosures of which are incorporated herein by reference for all purposes.

BACKGROUND

1. Field of the Invention

One or more example embodiments relate to a microlens array-based ultrathin microscope.

2. Description of the Related Art

In addition to the recent corona, since the world is currently being infected with a variety of viruses, a demand for field diagnostic equipment of the virus is increasing and a market is also steadily increasing by reflecting the increasing demand.

For example, the field diagnostic equipment is used for detecting a specific target material in a liquid sample such as a blood sample in a disease diagnosis, etc., or examining a very small amount of biological material in various fields including a biological field, an environmental field, a chemical field, etc., and adopts a microscope for reading a fluorescent signal. An existing microscope may perform accurate examination based on a photodiode, but may not observe a complicated structure and has a disadvantage in that a fluorescent filter should be replaced during multiple fluorescence. Further, a currently developed microscope has a disadvantage in that a price is high and a volume is large, and it is difficult to acquire an image or a high-resolution image.

Therefore, in the present disclosure, a microscope may be designed, which is inexpensive and ultrathin by using a camera and a filter manufactured by a semiconductor process, and the present disclosure may be used for various fields in addition to a field diagnostic device by using imaging of the ultrathin microscope according to the present disclosure.

SUMMARY

To solve the aforementioned problem, an aspect provides a microlens array-based ultrathin microscope which may be manufactured in a large area process, and may have high versatility and may be subjected to field diagnosis and/or multiple diagnosis through multiple imaging and image reconstruction by using microlens arrays and filters easily applicable to various substrates.

Objects to be achieved by the present disclosure are not limited to the aforementioned objects, and other objects, which are not mentioned above, will be apparent to those skilled in the art from the following description.

According to an aspect, there is provided a microlens array-based ultrathin microscope including a filter unit configured to selectively transmit fluorescence manifested in a measurement sample, and an image unit configured to acquire an image from light transmitted by the filter unit, wherein the filter unit is formed to be in contact with or spaced apart from one surface of a transparent substrate, and the image unit includes a microlens array formed on an opposite surface to the transparent substrate in which the filter unit is formed, and an image sensor configured to collect image information of the microlens array.

According to an example embodiment, the microlens array may include a plurality of lenses arranged at a pitch interval of 500 µm to 2 mm, and a diameter of the microlens may be 2 mm or less.

According to an example embodiment, each of the plurality of lenses of the microlens array may provide individual image information, and the image sensor may generate multiple spectrum images by collecting a plurality of pieces of individual image information of the microlens array.

According to an example embodiment, the multiple spectrum images may include image information at the same position in the measurement sample.

According to an example embodiment, the image sensor may generate a high-resolution fluorescent image by using the multiple spectrum images.

According to an example embodiment, the high-resolution fluorescent image may be separated according to a light wavelength, and the separated high-resolution fluorescent image may be analyzed to analyze a single or a plurality of sensing targets.

According to an example embodiment, the image sensor may be formed in an upper portion of the microlens array, and a separation distance between the image sensor and the microlens array may be 5 mm or less.

According to an example embodiment, a spacing between the image sensor and the filter unit may be 5 mm or less, and a spacing between the measurement sample and the filter unit may be 5 mm or less.

According to an example embodiment, a thickness of the transparent substrate may be 5 mm or less.

According to an example embodiment, the transparent substrate may include at least one of glass, a transparent polymer, and a transparent oxide.

According to an example embodiment, the filter unit may include a single bandpass filter or a plurality of bandpass filters, and the bandpass filter may transmit the fluorescence manifested in the measurement sample and block the light of an illumination unit.

According to an example embodiment, the bandpass filter may include a color filter, a plasmonic filter, or both of them.

According to an example embodiment, the transparent substrate may include a transparent base substrate, and a transparent layer formed on the transparent base substrate, the microlens array may be formed on the transparent layer, and the transparent layer may include the transparent oxide.

According to an example embodiment, the microscope may include a first layer formed between the transparent base substrate and the transparent layer, and a second layer formed on the transparent layer corresponding to a position of the first layer, and each of the first layer and the second layer may include a light absorption film, a light blocking layer, or both of them.

According to an example embodiment, the first layer may be inserted into the transparent layer, and each of the first layer and the second layer may be a single layer or a plurality of layers.

According to an example embodiment, the microlens array-based ultrathin microscope may monitor the measurement sample in a microfluidic system.

According to an example embodiment, the microlens array-based ultrathin microscope may be for field diagnosis, and may diagnose two or more diseases.

According to an example embodiment, the microlens array-based ultrathin microscope may further include an illumination unit configured to irradiate light to the measurement sample.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments of the present disclosure will be described in detail with reference to the accompanying drawings. In describing the example embodiments, a detailed description of related known functions or constitutions will be omitted if it is determined that they unnecessarily make the gist of the present disclosure unclear. Further, terms used in this specification as terms used for appropriately expressing a preferred embodiment of the present disclosure may vary depending on an intention of a user or an operator or a practice of a field to which the present disclosure pertains. Accordingly, definitions of the terms need to be described based on contents throughout this specification. Like reference numerals illustrated in the respective drawings designate like members.

Throughout this specification, it will be understood that when a member is referred to as being "on" another member, it may be directly on the other member or intervening members may also be present.

Throughout the specification, the word "comprise" and variations such as "comprises" or "comprising" will be understood to imply the inclusion of stated elements but not the exclusion of any other elements.

Hereinafter, a microlens array-based ultrathin microscope, a manufacturing method thereof, and utilization thereof will be described in detail with reference to example embodiments and drawings. However, the present disclosure is not limited to the example embodiments and drawings.

The present disclosure relates to a microlens array-based ultrathin microscope. According to an example embodiment, the microlens array-based ultrathin microscope which adopts an ultrathin imaging device to collect and fluorescent-image light of a measurement sample, e.g., fluorescent information may be used for monitoring, detection, analysis, and/or diagnosis through such an imaging process.

Figure 1:
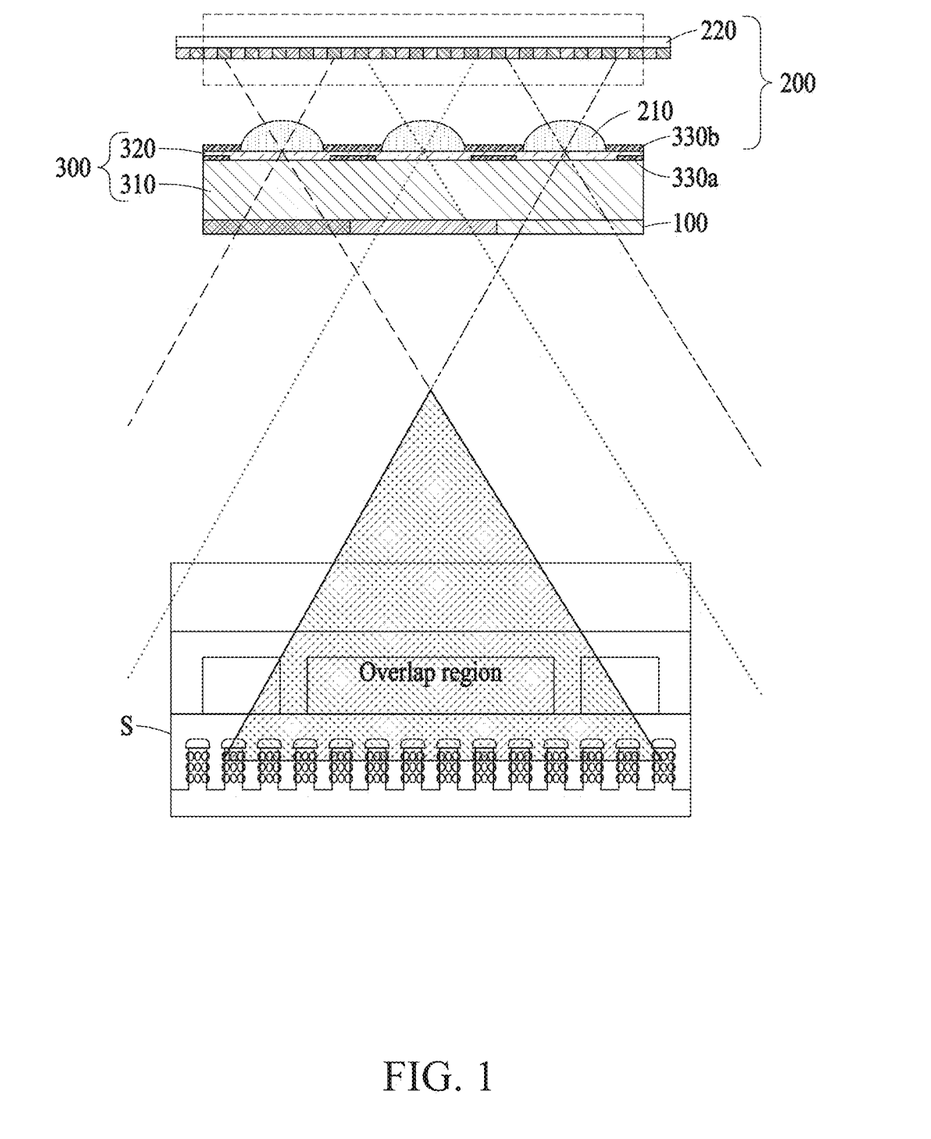
FIG. 1 exemplarily illustrates a configuration and an operation principle of a microlens array-based ultrathin microscope by the present disclosure, according to an example embodiment.

According to an example embodiment, referring to FIG. 1, FIG. 1 exemplarily illustrates main components of a microlens array-based ultrathin microscope by the present disclosure, according to an example embodiment, and the microlens array-based ultrathin microscope may include a filter unit 100; and an image unit 200, and include a transparent substrate 300 between the filter unit 100 and the imaging unit 200. A compact and ultrathin microscope may be provided with components of the filter unit 100 and the image unit 200, and a unique design for an array relationship thereof, and versatility of the microscope may be improved.

According to an example embodiment, the filter unit 100 selectively transmits and controls fluorescence manifested in a measurement sample, and the filter unit 100 may include a single bandpass filter or a plurality of bandpass filters.

As an example, the bandpass filter may transmit the fluorescence manifested in the measurement sample, and block the light of the illumination unit. Further, the bandpass filter classifies and transmits the fluorescence according to a light wavelength to provide continuous multiple images according to the light wavelength. The bandpass filter may include a color filter, a plasmonic filter, or both of them.

As an example, the filter unit 100 may be formed to be in contact with or separated from one surface of the transparent substrate 300. A microlens array 210 is formed on an opposite surface to one surface of a transparent substrate 300 (hereinafter, corresponding to a transparent base substrate 310) in which the filter unit 100 is disposed, and the transparent substrate 300 is used as a lens substrate of the microlens array 210. That is, according to the present disclosure, a structure in which the filter unit 100 and the image unit 200 are coupled to the same transparent substrate 300 or the transparent substrate 300 with the microlens array 210 of the image unit 200 is disposed between the filter unit 100 and the image unit 200 is applied to manufacture an ultrathin microscope capable of reducing a size and a thickness of the microscope and acquiring a high-resolution image.

According to an example embodiment, the image unit 200 acquires an image from the light transmitted in the filter unit 100, and the image unit 200 may include the microlens array 210, and an image sensor 220 collecting image information of the microlens array 210.

Figure 3A:
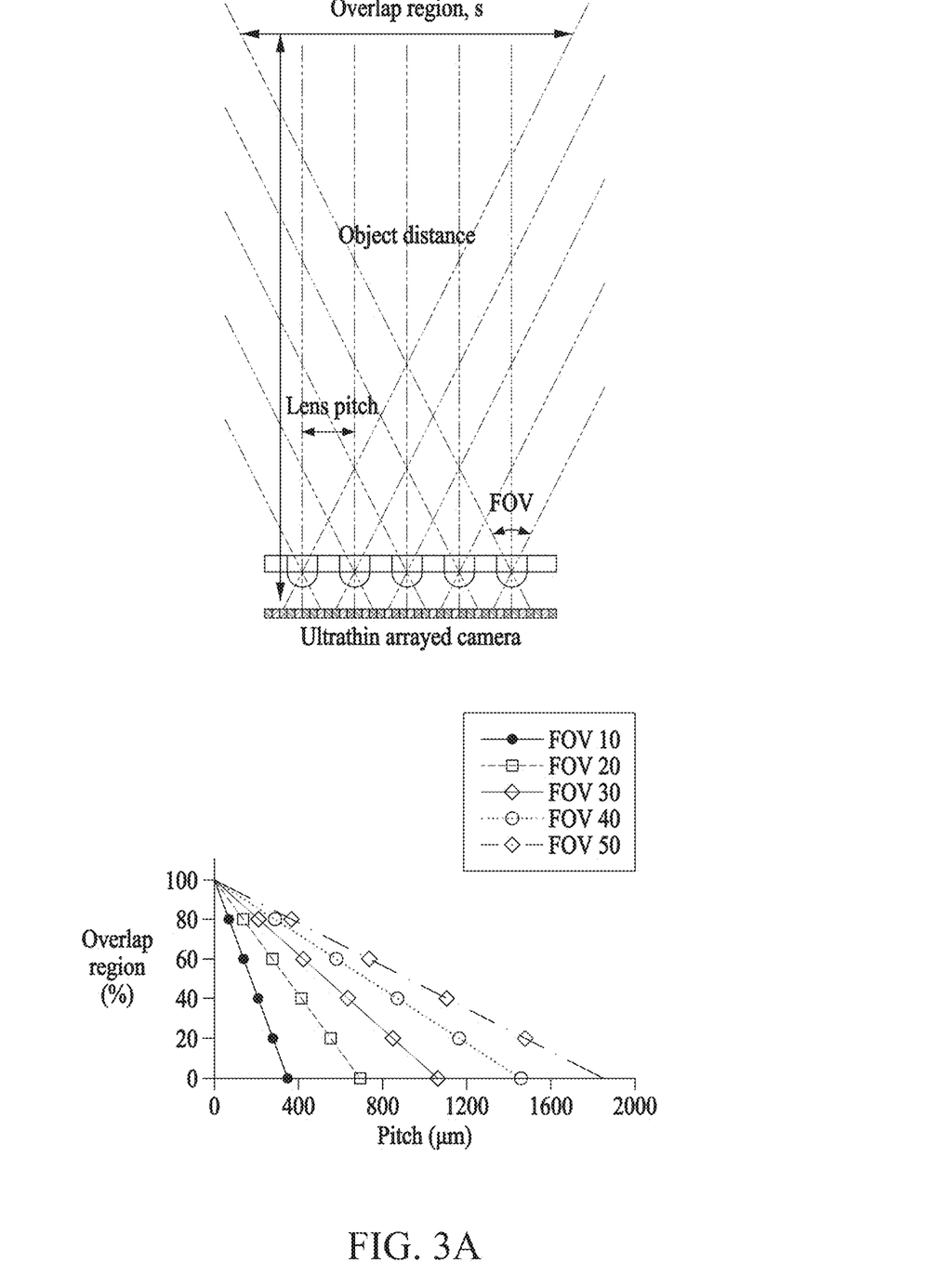
FIG. 3A exemplarily illustrates an optical design for securing continuity of an image in the microlens array-based ultrathin microscope by the present disclosure, according to an example embodiment.

As an example, the microlens array 210 may include a plurality of lenses arranged at a pitch interval of 500 μm to 3 mm; 500 μm to 2 mm; 500 μm to 1 mm; 600 μm to 900 μm; or 700 μm to 800 μm, and as illustrated in FIG. 3A, the microlens array 210 may be designed to acquire a high-resolution fluorescent image by controlling an overlap region and a focal distance of the fluorescent according to the pitch interval of the microlens. In FIG. 3A, an overlap region s is calculated according to Equation 1, and for example, when FOV=70°, lens pitch=3 mm, and object distance=10 mm, s=2*10·0.7−3=11 mm.

$$s = 2*d*\tan\frac{\theta}{2} - p \qquad \text{Equation 1}$$

Here, FOV=θ, Object distance=d, Lens pitch=p, and Overlap region=s.

Further, the diameter of the microlens may be 2 mm or less; 1.5 mm or less; 1 mm or less; 1 μm to 2 mm; 50 μm to 2 mm; 100 μm to 1 mm; and 100 μm to 500 μm, and when the diameter of the microlens is included in the above range, it may be advantageous for acquiring the high-resolution image. For example, as illustrated in FIG. 4B, the microlens array may be formed in a diameter of approximately 120 μm (or a height of approximately 20 μm).

Figure 3B:
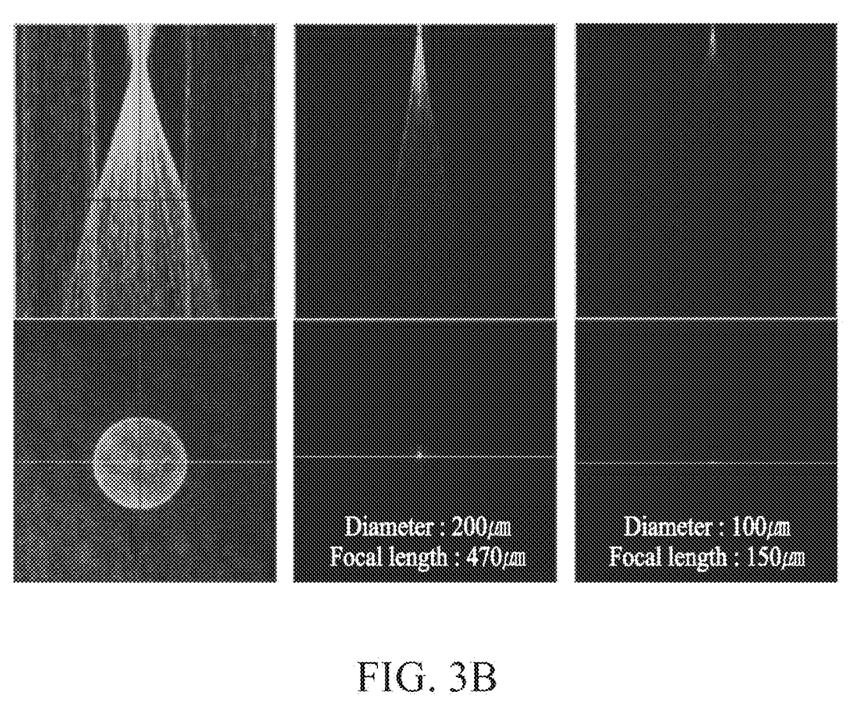
FIG. 3B illustrates evaluation of microlens optical characteristics by a microlens diameter in the microlens array-based ultrathin microscope by the present disclosure, according to an example embodiment.
Figure 3C:
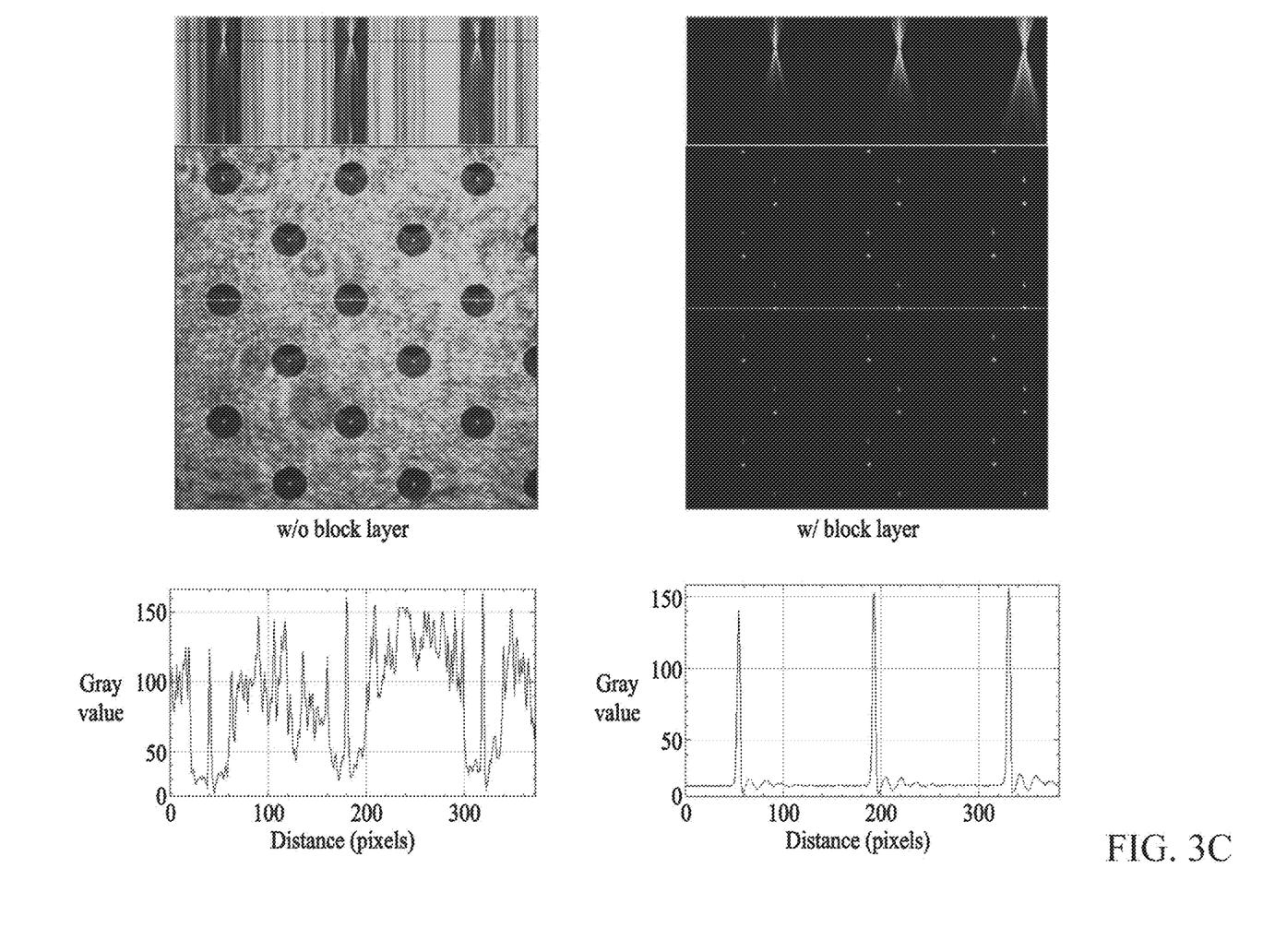
FIG. 3C illustrates evaluation of microlens optical characteristics by a light absorption film in the microlens array-based ultrathin microscope by the present disclosure, according to an example embodiment.

In FIGS. 3B and 3C, it may be seen that the focal distance of the microlens may be changed according to the diameter of the microlens and the resolution of the image may be increased through the light absorption film.

Figure 2A:
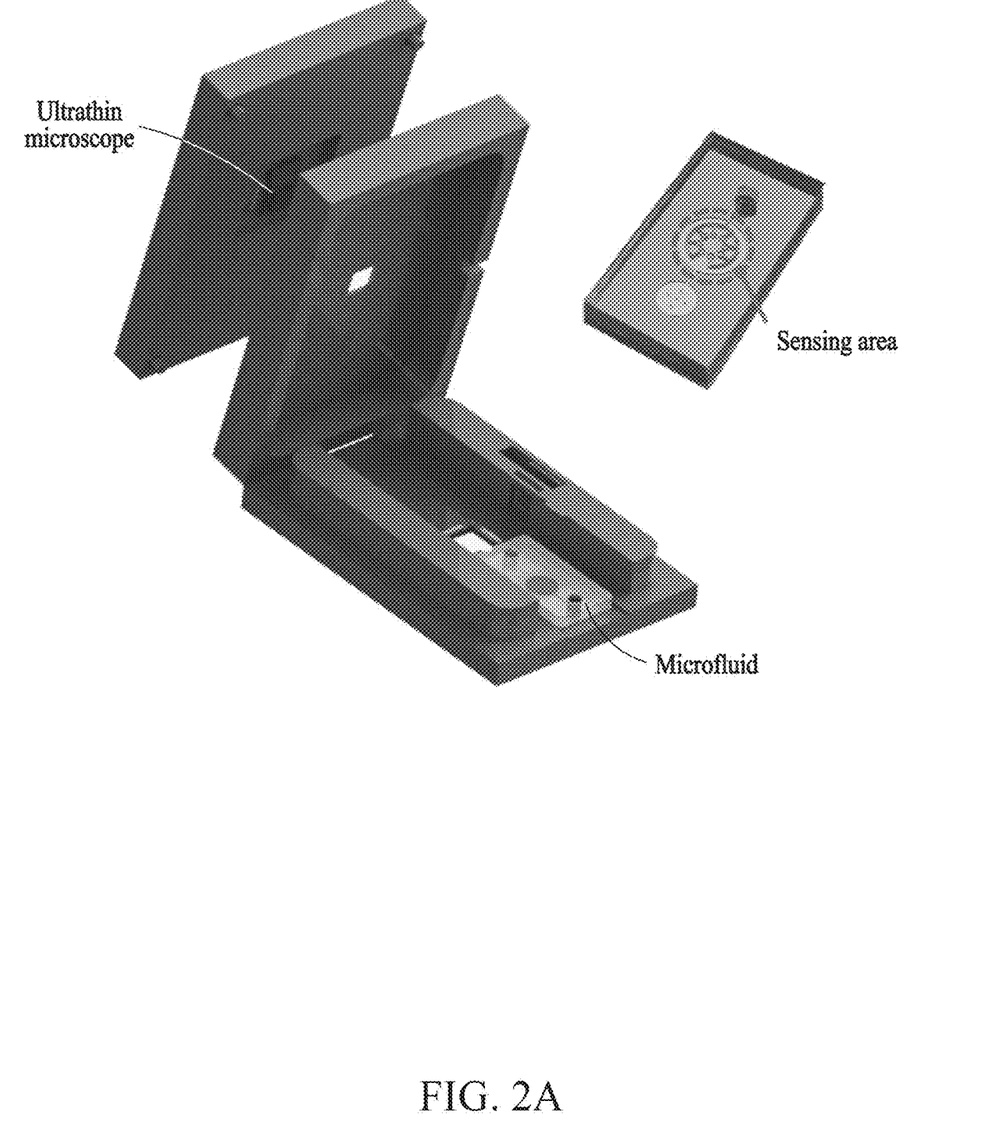
FIGS. 2A and 2B exemplary illustrates a configuration of a microfluidic system analysis device mounted with the microlens array-based ultrathin microscope by the present disclosure and a fluorescent image acquired by the microlens array-based ultrathin microscope, according to an example embodiment.
Figure 2B:
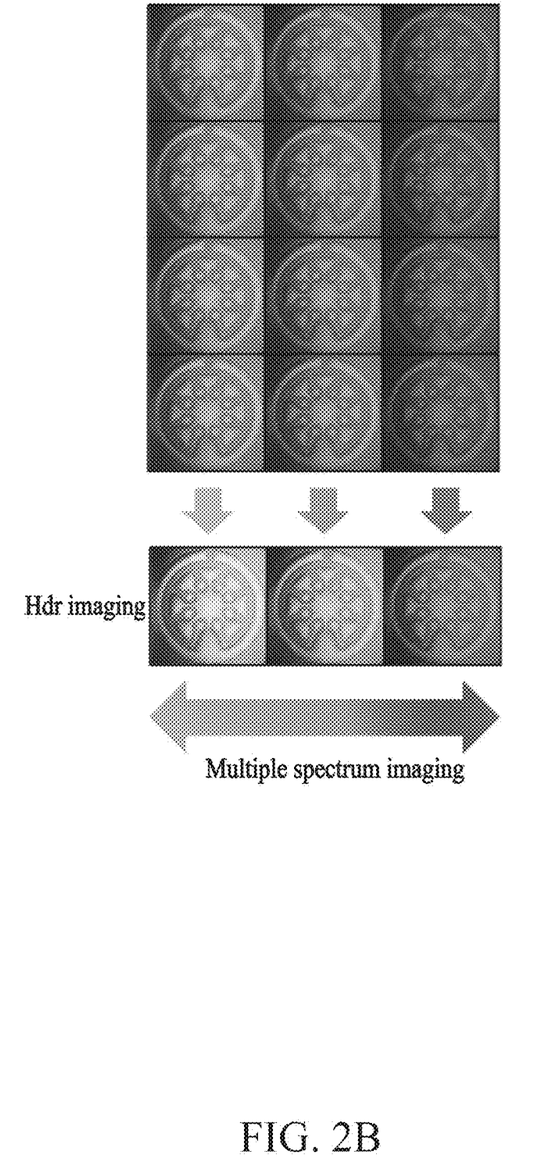

As an example, the plurality of lenses of the microlens array 210 as micro cameras may provide individual images, respectively and acquire multiple spectrum images by using the provided images. That is, an image sensor collects a plurality of pieces of individual image information of the microlens array 210 to generate the multiple spectrum images. As illustrated in FIGS. 2A and 2B, the multiple spectrum images are acquired from the fluorescent image manifested in the microfluidic sample in the diagnosis device, and in FIG. 2B, the multiple spectrum images may include multiple spectrum images in which the fluorescence manifested in the measurement sample is classified and controlled according to a light wavelength through the filter unit. In this case, it may be seen that the fluorescence is manifested in the same space from individual image information (individual images) at the same position in the measurement sample, and the image sensor may generate a high-resolution fluorescent image by using the multiple spectrum images, and perform multiple analyses such as multiple diagnoses, etc.

As an example, the high-resolution fluorescent image may be classified according to the light wavelength, and the classified high-resolution fluorescent image is analyzed to monitor, analyze, detect, and/or diagnose a single or a plurality of detection targets.

As an example, the image sensor 220 is formed on the top of the microlens array 210 and the image sensor 220 corresponds to a semiconductor sensor, and a semiconductor sensor applicable in the technical field of the present disclosure may be applied without a limit, and is not specifically mentioned in this specification. For example, the semiconductor sensor may include a CMOS layer and configure CMOS ISA setup, etc.

As an example, a separation distance between the image sensor 220 and the microlens array 210 may be 300 μm to 5 mm; 500 μm to 4 mm; 600 μm to 3 mm; 800 μm to 2 mm; or 800 μm to 1 mm.

According to an example embodiment, the transparent substrate 300 may include a transparent base substrate 310; and a transparent layer 320 formed on the transparent base substrate 310, and the microlens array 210 may be formed on the transparent layer 320.

As an example, a thickness of the transparent substrate 300 may be 300 μm to 1 mm; 500 μm to 1 mm; 600 μm to 900 μm; or 700 μm to 900 μm, and the thickness range is applied to provide an ultrathin microscope capable of acquiring the high-resolution fluorescent image.

As an example, if the transparent substrate 300 adopts a transparent material, the transparent substrate 300 is applied without a limit, and may include, for example, at least one of glass, a transparent polymer, and a transparent oxide. The transparent layer 320 may include the transparent oxide, and include tens to hundreds of nanometers thick, and the thickness may be, for example, 10 nm or more; 20 nm or more; 10 nm to 1000 nm (or less than 1000 nm); 10 nm to 500 nm; 30 nm to 300 nm; 50 nm to 200 nm; or 50 nm to 100 nm.

According to an example embodiment, in the transparent substrate 300, an area may be formed between the microlenses, which absorbs and/or blocks light in order to increase the resolution of the fluorescent image, and may be formed on the surface of or inside the transparent substrate 300, or formed in both of them. For example, the transparent substrate 300 may include a first layer 330a formed between the transparent base substrate 310 and the transparent layer 320, and a second layer 330b formed on the transparent layer 320 corresponding to a position of the first layer 330a. Further, the first layer 330a may be inserted into the transparent layer 320.

As an example, the first layer 330a and the second layer 330b may be the same or different in at least one of the thickness, a component, the diameter, a width, and a shape. For example, each of the first layer 330a and the second layer 330b may have a thickness of hundreds of nanometers to tens micrometers, and the thickness may be, for example, 100 nm or more; 200 nm or more; 300 nm to 100 μm (or less than 100 μm); 300 nm to 90 μm; 400 nm to 50 μm; or 500 nm to 20 μm.

As an example, each of the first layer 330a and the second layer 330b may include a light absorption film, a light blocking film, or both of them. Each of the first layer 330a and the second layer 330b may be a single layer or a plurality of layers, and each of the plurality of layers may include the same or different film. For example, in the first layer 330a and the second layer 330b, different films may be arranged to face each other or the same film may be configured. Further, when the light blocking film and the light absorption film are simultaneously formed in each of the first layer 330a and the second layer 330b, the light blocking film and the light absorption film may be layered and stacked.

According to an example embodiment, a spacing between the filter unit 100 and the image sensor 220 of the image unit 200 may be 5 mm or less, and further, a spacing between a measurement sample S and the filter unit 100 may be 5 mm or less, for example, may be 500 μm to 5 mm; 600 μm to 4 mm; 800 μm to 3 mm; or 800 μm to 2 mm.

According to an example embodiment, the microscope may further include the illumination unit 400, and the illumination unit 400 may include a light emitting element for manifesting and/or reinforcing a specific wavelength area for imaging by irradiating light to the measurement sample, and for example, may include a lamp, an LED, a laser, etc., for irradiating light for fluorescent manifesting to the measurement sample, but is not limited thereto. The illumination unit 400 may be disposed at a position where the fluorescent manifesting of the measurement sample is possible without a limit, and the measurement sample may be disposed between the illumination unit 400 and the filter unit 100. For example, as illustrated in FIGS. 2A and 2B, the illumination unit 400 may be disposed so that the light is irradiated in a bottom area of the measurement sample in a field diagnostic device chamber.

According to an example embodiment, in the microscope by the present disclosure, a fluorescent reader, a fluorescent diagnostic device chamber, a sensor, etc., may be used in bio, environmental, and chemical fields. For example, in a microfluidic field, the microscope is disposed on a rear surface of a microfluid chip to analyze, identify, detect, monitor, analyze, and/or image change and analysis targets of a fluid, e.g., molecules, particles, and DNA. Further, the microscope is applied to a field examiner to identify whether various diseases are infected in the field. Further, imaging the analysis target is possible to provide a new molecular diagnosis device for field diagnosis. For example, referring to FIG. 2A, as the microfluid analysis device, a microscope by the present disclosure may be configured, in which a substrate including a microfluid, an illumination unit formed in a lower area of the substrate, a filter unit at a height spaced apart from the microfluid in a vertical direction to correspond to a position of the illumination unit, and the image unit are arranged in order. In addition, the microfluid may include a sensing area.

According to an example embodiment, the microscope by the present disclosure acquires the multiple spectrum images to analyze a single or a plurality of sensing targets, and for example, the microscope may be used for a diagnosis device for field diagnosis that diagnoses two or more diseases.

According to an example embodiment, an imaging method of an analysis target using the microscope by the present disclosure may be provided, and the imaging method may be used for identifying, detecting, monitoring, and/or analyzing the analysis target. According to the present disclosure, the imaging method may include preparing a measurement sample, manifesting fluorescence by irradiating light to the measurement sample, transmitting the manifested fluorescence through a filter unit and transferring the transmitted fluorescence to a microlens array, and collecting an image from the microlens array. In the collecting of the image, multiple spectrum images may be generated by using an individual image acquired from each lens of the microlens array by an image sensor, and the multiple spectrum images may be converted into high-resolution fluorescent images. Multiple images may be generated for each wavelength for the fluorescence manifested at the same position in the measurement sample, and the multiple spectrum images may be converted into the high-resolution fluorescent images for each wavelength by using the multiple images.

The present disclosure relates to a manufacturing method of the microscope by the present disclosure, and according to an example embodiment, the manufacturing method may include step S100 of preparing a filter unit, step S200 of preparing a microlens array, step S300 of preparing an image sensor, and step S400 of assembling the filter unit, the microlens array, and the image sensor. The microscope formed by the manufacturing method is mentioned similarly to the description of the microscope by the present disclosure, and component and components in each process are not specifically mentioned.

In the manufacturing method, the filter unit and the microlens array may be formed on one transparent substrate as mentioned above, and the microlens array and the filter unit adopt various transparent substrates by a semiconductor process, and are able to be manufactured in a large area to be used for various devices. Further, according to the present disclosure, since the filter unit and the microlens array are formed on one transparent substrate, an ultrathin microscope capable of acquiring a high-resolution fluorescent image may be manufactured.

Figure 4A:
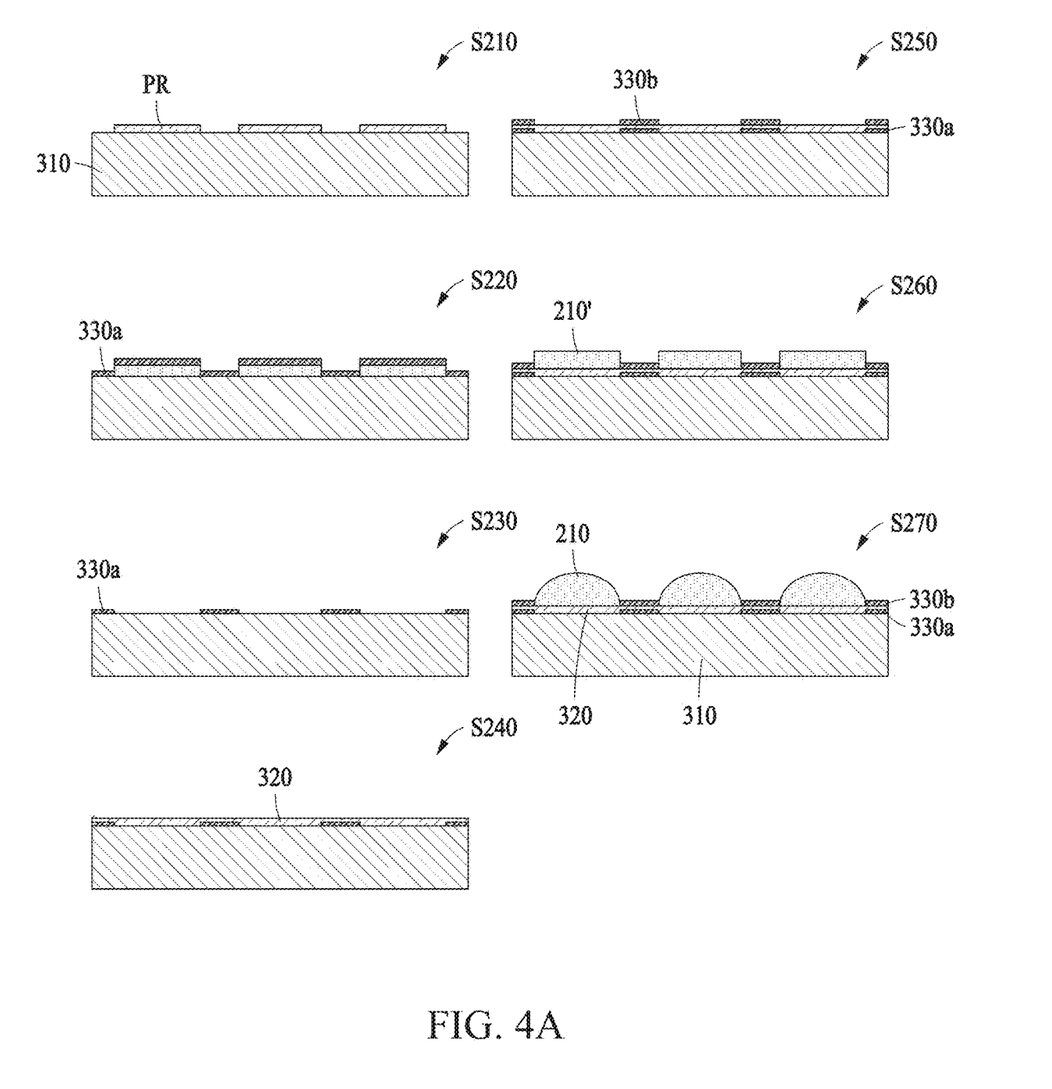
FIG. 4A exemplarily illustrates a manufacturing process of a microlens array by the present disclosure, according to an example embodiment.
Figure 4B:
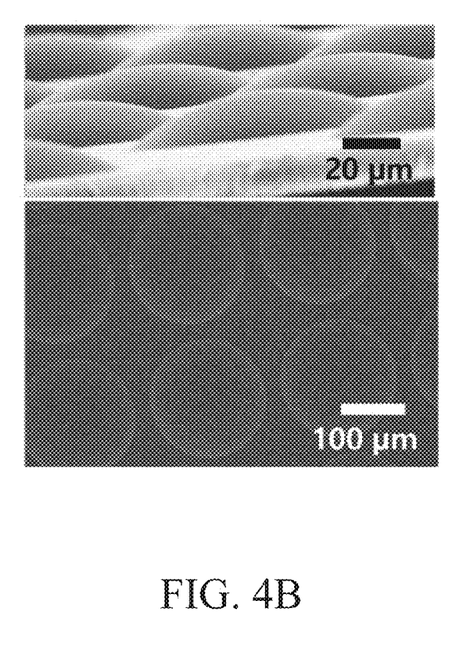
FIG. 4B illustrates an image of the microlens array by the present disclosure, which is manufactured by the method of FIG. 4A, according to an example embodiment.

As an example, a manufacturing order of the filter unit and the microlens array is not particularly limited, but as illustrated in FIG. 4A, the prepared filter unit may be coupled or assembled after manufacturing the microlens array. More specifically, referring to FIG. 4A, the manufacturing method may include step S210 of patterning a mask PR on a transparent base substrate 310, step S220 of depositing a first metal layer 330a on one surface of the transparent base substrate 310 in which the patterned mask PR is formed, step S230 of forming the patterned first metal layer 330a by lifting off the mask PR, step S240 of depositing a transparent layer 320 so as to cover the patterned first metal layer 330a, step S250 of depositing a patterned second metal layer 330b on an upper portion of the transparent layer 320 corresponding to a position of the patterned first metal layer 330a, step S260 of forming a patterned transparent polymer layer 210' on the transparent layer 320 exposed in the patterned second metal layer 330b, and step S270 of forming a microlens array 210 through thermal reflow by applying heat to the transparent polymer layer 210'.

As an example, if the transparent base substrate 310 is a transparent material having a light transmission function, such as glass, a transparent polymer, etc., the transparent base substrate 310 may be applied without a limit.

As an example, the mask PR may include photoresists including AZ5214, PR2035, DNR, GXR, AZ5206, PR9260, SU-8 etc.

As an example, the first metal layer 330a and the second metal layer 330b may be the same or different in at least one of the thickness, a component, the diameter, and a shape. Preferably, the first metal layer 330a and the second metal layer 330b are patterned in the same form so as to have a space in which the microlens array may be formed, and for example, may be patterned so that the transparent layer 320 is exposed in a dot (or circular) form. The first metal layer 330a and the second metal layer 330b may form an area which may absorb or block light, and each of the first metal layer 330a and the second metal layer 330b may include a light blocking metal film such as black polymer, aluminum, chromium, etc. Each of the first metal layer 330a and the second metal layer 330b may include a light absorption film, a light blocking film, or both of them.

As an example, if the transparent polymer layer 210' applicable as a microlens material may be applied without a limit, the transparent polymer layer 210' may be, for example, AZ5214, PR2035, DNR, GXR, AZ5206, PR9260, SU-8, etc., and may be preferably DNR.

As an example, after step S270 of forming of the microlens array, the filter unit 100 may be attached to an opposite surface to the transparent base substrate 310 in which the microlens array 210 is formed.

As an example, the deposition may adopt a method such as magnetron sputtering, thermal evaporation, chemical vapor deposition (CVD), plasma enhanced chemical vapor deposition (PECVD), atomic layer deposition (ALD), etc., but is not limited thereto.

As an example, in step S400, the illumination unit 400, the filter unit 100, and the image unit 200 are assembled according to a device on which the microscope is mounted, and the illumination unit 400, the filter unit 100, and the image unit 200 may be appropriately assembled by considering the configuration of the microscope, and the illumination unit 400, the filter unit 100, and the image unit 200 may be assembled so that the measurement sample is positioned between the illumination unit 400 and the filter unit 100.

According to example embodiments, it may be possible to provide a microlens array-based ultrathin microscope which may generate a high-resolution image, and may be large area, compact, and/or light as compared with an existing microscope, to be applied universally applied to various diagnostic devices.

According to example embodiments, it may be possible to provide a fluorescence diagnosis device which may perform high-resolution multi-fluorescence imaging through images acquired through each lens in a microlens array, may be used for a diagnosis, analysis, and/or sensing device in various fields including a biological field, a chemical field, an environmental field, etc., and may, in particular, use a fluorescent image.

While this disclosure includes example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A microlens array-based ultrathin microscope comprising:
    a filter unit configured to selectively transmit fluorescence manifested in a measurement sample; and
    an image unit configured to acquire an image from light transmitted by the filter unit,
    wherein the filter unit is formed to be in contact with or spaced apart from one surface of a transparent substrate, and
    the image unit includes a microlens array formed on an opposite surface to the transparent substrate in which the filter unit is formed, and an image sensor configured to collect image information of the microlens array,
    wherein
    the transparent substrate includes:
        a transparent base substrate; and
        a transparent layer formed on the transparent base substrate,
    the microlens array is formed on the transparent layer, and
    the transparent layer includes a transparent oxide.

2. The microlens array-based ultrathin microscope of claim 1, wherein
    the microlens array includes a plurality of lenses arranged at a pitch interval of 500 μm to 2 mm, and
    a diameter of the microlens is 2 mm or less.

3. The microlens array-based ultrathin microscope of claim 1, wherein
    each of the plurality of lenses of the microlens array provides individual image information, and
    the image sensor generates multiple spectrum images by collecting a plurality of pieces of individual image information of the microlens array.

4. The microlens array-based ultrathin microscope of claim 3, wherein the multiple spectrum images include image information at a same position in the measurement sample.

5. The microlens array-based ultrathin microscope of claim 3, wherein the image sensor generates a high-resolution fluorescent image by using the multiple spectrum images.

6. The microlens array-based ultrathin microscope of claim 5, wherein
    the high-resolution fluorescent image is separated according to a light wavelength, and
    the separated high-resolution fluorescent image is analyzed to analyze a single or a plurality of sensing targets.

7. The microlens array-based ultrathin microscope of claim 1, wherein
    the image sensor is formed in an upper portion of the microlens array, and
    a separation distance between the image sensor and the microlens array is 5 mm or less.

8. The microlens array-based ultrathin microscope of claim 1, wherein
    a spacing between the image sensor and the filter unit is 5 mm or less, and
    a spacing between the measurement sample and the filter unit is 5 mm or less.

9. The microlens array-based ultrathin microscope of claim 1, wherein a thickness of the transparent substrate is 5 mm or less.

10. The microlens array-based ultrathin microscope of claim 1, wherein the transparent substrate includes at least one of glass, a transparent polymer, and a transparent oxide.

11. The microlens array-based ultrathin microscope of claim 1, wherein
    the filter unit includes a single bandpass filter or a plurality of bandpass filters, and
    the bandpass filter transmits the fluorescence manifested in the measurement sample and blocks the light of an illumination unit.

12. The microlens array-based ultrathin microscope of claim 11, wherein the bandpass filter includes a color filter, a plasmonic filter, or both of them.

13. The microlens array-based ultrathin microscope of claim 1, wherein
    the microscope includes:
        a first layer formed between the transparent base substrate and the transparent layer; and
        a second layer formed on the transparent layer corresponding to a position of the first layer, and
    each of the first layer and the second layer includes a light absorption film, a light blocking layer, or both of them.

14. The microlens array-based ultrathin microscope of claim 13, wherein
    the first layer is inserted into the transparent layer, and
    each of the first layer and the second layer is a single layer or a plurality of layers.

15. The microlens array-based ultrathin microscope of claim 1, wherein the microlens array-based ultrathin microscope monitors the measurement sample in a microfluidic system.

16. The microlens array-based ultrathin microscope of claim 1, wherein the microlens array-based ultrathin microscope is for field diagnosis, and
    diagnoses two or more diseases.

17. The microlens array-based ultrathin microscope of claim 1, further comprising:
an illumination unit configured to irradiate light to the measurement sample.

* * * * *